United States Patent
Adachi et al.

(10) Patent No.: US 9,335,356 B2
(45) Date of Patent: May 10, 2016

(54) INDUCTANCE MEASURING DEVICE AND MEASURING METHOD FOR SYNCHRONOUS MOTOR

(75) Inventors: Shoji Adachi, Chiyoda-ku (JP); Yoshihiko Kinpara, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 251 days.

(21) Appl. No.: 13/884,486

(22) PCT Filed: Dec. 6, 2010

(86) PCT No.: PCT/JP2010/007080
§ 371 (c)(1),
(2), (4) Date: Jun. 12, 2013

(87) PCT Pub. No.: WO2012/077153
PCT Pub. Date: Jun. 14, 2012

(65) Prior Publication Data
US 2014/0002110 A1    Jan. 2, 2014

(51) Int. Cl.
*G01R 27/28* (2006.01)
*G01R 27/26* (2006.01)
*H02P 21/14* (2016.01)

(52) U.S. Cl.
CPC .......... *G01R 27/2611* (2013.01); *H02P 21/145* (2013.01)

(58) Field of Classification Search
CPC . G01R 27/2611; A61B 5/0031; A61B 5/2014
See application file for complete search history.

(56) References Cited

U.S. PATENT DOCUMENTS

| | | | | |
|---|---|---|---|---|
| 4,284,943 A | * | 8/1981 | Rowe | E21B 43/128 137/487.5 |
| 5,057,759 A | * | 10/1991 | Ueda | H02P 21/0039 318/561 |
| 5,262,935 A | * | 11/1993 | Shirahama | H02M 7/493 363/37 |
| 5,294,876 A | * | 3/1994 | Jonsson | H02P 21/10 318/803 |
| 2003/0030404 A1 | * | 2/2003 | Iwaji | H02P 23/004 318/700 |
| 2004/0138837 A1 | * | 7/2004 | Fujii | G01R 31/343 702/64 |
| 2009/0066360 A1 | * | 3/2009 | Kunzel | G01R 31/343 324/765.01 |
| 2010/0277149 A1 | * | 11/2010 | Furutani | H02M 1/0845 323/282 |
| 2011/0102012 A1 | * | 5/2011 | Messersmith | G01R 31/343 324/765.01 |
| 2013/0173193 A1 | * | 7/2013 | Yan | G01R 31/34 702/66 |
| 2014/0163912 A1 | * | 6/2014 | Gao | G01R 31/34 702/65 |

FOREIGN PATENT DOCUMENTS

| | | |
|---|---|---|
| JP | 2001-069782 A | 3/2001 |
| JP | 2002-252995 A | 9/2002 |
| JP | 2002-262599 A | 9/2002 |
| JP | 2002-272195 A | 9/2002 |
| JP | 2003-284398 A | 10/2003 |
| JP | 2008-086129 A | 4/2008 |
| JP | 2008-092657 A | 4/2008 |
| JP | 2008-301619 A | 12/2008 |
| JP | 2010-035363 A | 2/2010 |

* cited by examiner

*Primary Examiner* — Tung X Nguyen
*Assistant Examiner* — Dominic Hawkins
(74) *Attorney, Agent, or Firm* — Sughrue Mion, PLLC; Richard C. Turner (57) ABSTRACT

[Problem]
For measuring the inductance of a synchronous motor, a high-speed and convenient inductance measuring device for a synchronous motor is provided.
[Solution]
A three-phase high-frequency rotation voltage is applied to a synchronous motor, thereby calculating the inductance from the same frequency component as that of the high-frequency voltage included in a motor current.

3 Claims, 6 Drawing Sheets

INDUCTANCE MEASURING DEVICE AND MEASURING METHOD FOR SYNCHRONOUS MOTOR

CROSS REFERENCE TO RELATED APPLICATIONS

This application is a National Stage of International Application No. PCT/JP2010/007080, filed on Dec. 6, 2010, the contents of all of which are incorporated herein by reference in their entirety.

TECHNICAL FIELD

The present invention relates to a device for measuring the inductance of a synchronous motor controlled by an inverter, and a measuring method therefor.

BACKGROUND ART

As a conventional method of measuring the inductance of a synchronous motor, for example, an inductance measuring method is disclosed in Patent Document 1, in which, by applying an ac voltage (so-called an alternating-current voltage) in a direction parallel to a dc axis rotating at an arbitrary frequency, an ac current having the same frequency component as that of the ac voltage is detected from a dc-axis current obtained by converting a motor current (a u-phase current and a w-phase current) detected by a current detector using a coordinate converter for converting it to a current on the dc axis as an application axis of the ac voltage, and then, the inductance is calculated from the maximum and the minimum values of the ac current and the ac voltage during a period when the dc axis rotates at an electrical angle of 180 degrees or more.

As a control device for a permanent-magnet-type synchronous motor, the following technology is disclosed in Patent Document 2. That is, by applying an ac voltage in a direction parallel to a permanent magnet of the synchronous motor, a d-axis current as a current component parallel to the permanent magnet of the synchronous motor is detected, thereby time-integrating the ac voltage to calculate a d-axis magnetic flux. According to the result, a hysteresis curve is drawn by plotting the d-axis current on the horizontal axis and the d-axis magnetic flux on the vertical axis, an average curve passing through the middle of the hysteresis curve is obtained, and, by adding an offset to the vertical axis of the average curve, the second average curve passing through the origin is obtained. Then, the slope of the straight line connecting a point on the second average curve corresponding to each d-axis current value and the origin is obtained as a d-axis inductance for each d-axis current value. Moreover, in addition to the d-axis inductance, by applying the ac voltage in a direction perpendicular to the permanent magnet of the motor, a q-axis current as the current component perpendicular to the permanent magnet of the motor is detected, thereby obtaining a q-axis inductance by a method similar to that of the d-axis inductance. That is, the inductance measuring method is disclosed therein.

In Patent Document 3, a method of identifying the inductance value of the motor is disclosed as follows. A high frequency rectangular wave signal is superimposed on a current command value or a voltage command value. When the high frequency rectangular wave signal is superimposed on the current command value, a rectangular wave signal component is extracted from a second current command value calculated so as to match a current detection value with a d-axis or q-axis current command value on which the rectangular wave signal is superimposed, a d-axis or q-axis inductance setting value is multiplied by a ratio of an absolute value of the extracted rectangular wave signal and an absolute value of the superimposed rectangular wave signal, whereby the inductance value of the motor is identified. On the other hand, when the high frequency rectangular wave signal is superimposed on the voltage command value, the rectangular wave signal component is extracted from the current detection value, and the absolute value of the extracted rectangular wave signal is divided by an absolute value of the rectangular wave signal superimposed on a d-axis or q-axis voltage command value, whereby the inductance value of the motor is identified.

PRIOR ART DOCUMENTS

Patent Documents

[Patent Document 1]
Japanese Laid-Open Patent Publication No. 2002-272195
[Patent Document 2]
Japanese Laid-Open Patent Publication No. 2001-69782
[Patent Document 3]
Japanese Laid-Open Patent Publication No. 2008-92657

DISCLOSURE OF THE INVENTION

Problems to be Solved by the Invention

However, the technology disclosed in Patent Document 1 relates to the system in which the alternating-current voltage is applied to the motor, and the alternating-current voltage is also needed to be applied in the direction at the angle varying at least from 0 degree to 180 degrees. Moreover, because the coordinate convert from the dc-axis voltage to the three-phase voltage becomes needed, a problem has been that a certain time is required for measuring the inductance of the synchronous motor.

Because the technology disclosed in Patent Document 2 relates to the system in which the alternating-current voltage applied for measuring the inductance is applied in the parallel and the perpendicular directions with reference to the position of the magnetic pole (permanent magnet), a problem has been that the detection of the magnetic-pole position is needed before measuring the inductance.

Moreover, because the technology disclosed in Patent Document 3 described above relates to the system in which the high-frequency rectangular wave signal is superimposed on the d-axis or the q-axis current command value or voltage command value, the current control calculation, the vector control calculation, and the calculation for converting the voltage coordinate are needed for measuring the inductance; therefore, a problem has occurred that more time is needed before completion of all the above calculations to measure the inductance of the synchronous motor.

The present invention is made to solve the above described problem, in which, by applying a three-phase high-frequency rotation voltage to a synchronous motor, an inductance is calculated from the same frequency component as that of the high-frequency voltage included in a motor current. Accordingly, an objective of the present invention is to provide a high-speed and a convenient inductance measuring device for the synchronous motor and a measuring method therefor, in which the voltage coordinate conversion, the detection of the magnetic-pole position before measuring the inductance, and the current control calculation and vector control calculation as described above are not needed.

Means for Solving the Problem

An inductance measuring device for a synchronous motor according to the present invention includes: a voltage converter for converting a high-frequency voltage command to apply to the synchronous motor; a voltage command generator for generating the high-frequency voltage command to be inputted to the voltage converter; a current detector for detecting a current of the synchronous motor; a coordinate converter for converting the current detected by the current detector into a current on an orthogonal biaxial coordinate system positioned in an arbitrary phase with respect to a fixed coordinate system, to output a current in one axis of the orthogonal biaxial coordinate system; a fundamental wave component extractor for extracting the same frequency component as that of the high-frequency voltage included in the current in the one axis of the orthogonal biaxial coordinate system; and an inductance calculator for calculating an inductance from a root-mean-square value and a frequency of the high-frequency voltage, and an output from the fundamental wave component extractor. Specifically the voltage command generator generates a variable voltage root-mean-square value, and a three-phase high-frequency rotation voltage command having a frequency, as a fundamental frequency, sufficiently higher compared with the maximum value of a rotation frequency at which the synchronous motor can synchronously rotate, and outputs them to the voltage converter.

Advantageous Effect of the Invention

As described above, according to the present invention, by using the three-phase high-frequency rotation voltage as the voltage command to the synchronous motor, the coordinate conversion of the voltage, the detection of the magnetic-pole position before measuring the inductance, and the current control calculation and vector control calculation that are conventionally needed are not needed, and the high-speed and convenient inductance measurement for the synchronous motor can be achieved.

BEST MODE FOR CARRYING OUT THE INVENTION

Embodiment 1

Figure 1:
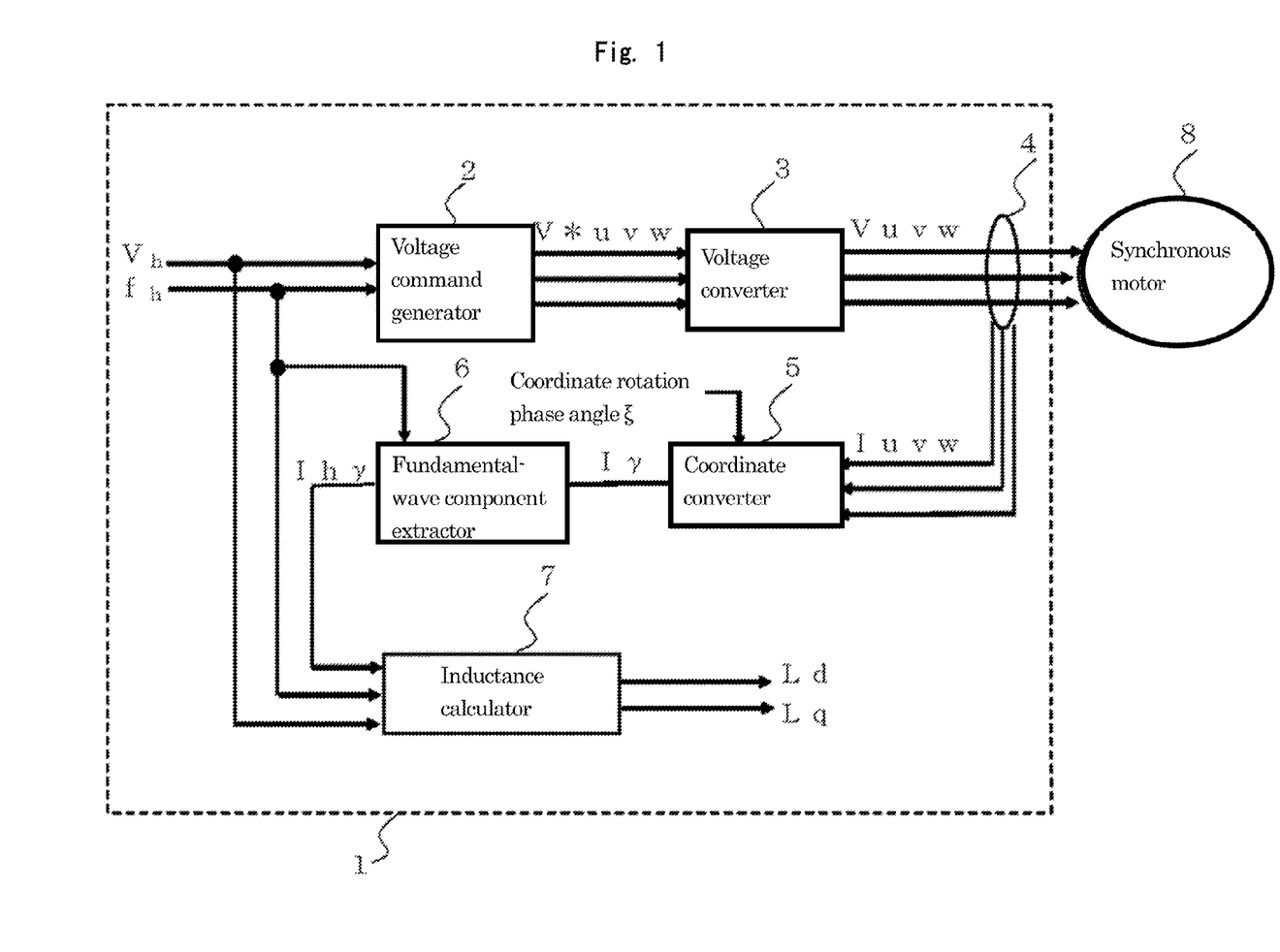
FIG. 1 is a diagram representing an inductance measuring device for a synchronous motor according to Embodiment 1 of the present invention.

FIG. 1 represents an inductance measuring device for a synchronous motor according to Embodiment 1. Here, the invention is not limited to the embodiment. In FIG. 1, a voltage command generator 2 in an inductance measuring device 1 generates, as a voltage command to a voltage converter 3, a three-phase high-frequency rotation voltage command V*uvw, in which the fundamental frequency of the output voltage of the voltage converter 3 is fh, and the root-mean-square value of the component at a frequency fh of the output voltage is Vh. Here, the three-phase high-frequency rotation voltage command V*uvw has a fundamental frequency as a sufficiently high frequency not to rotate a synchronous motor 8, and is a three-phase ac voltage command in which voltage root-mean-square values of the phases are equivalent to each other, and the phase difference of each phase is 120 degrees. The three-phase high-frequency rotation voltage command V*uvw is converted, using the voltage converter 3, to a three-phase voltage Vuvw by a known triangular wave comparison PWM system, and then applied to the synchronous motor 8.

Figure 2:
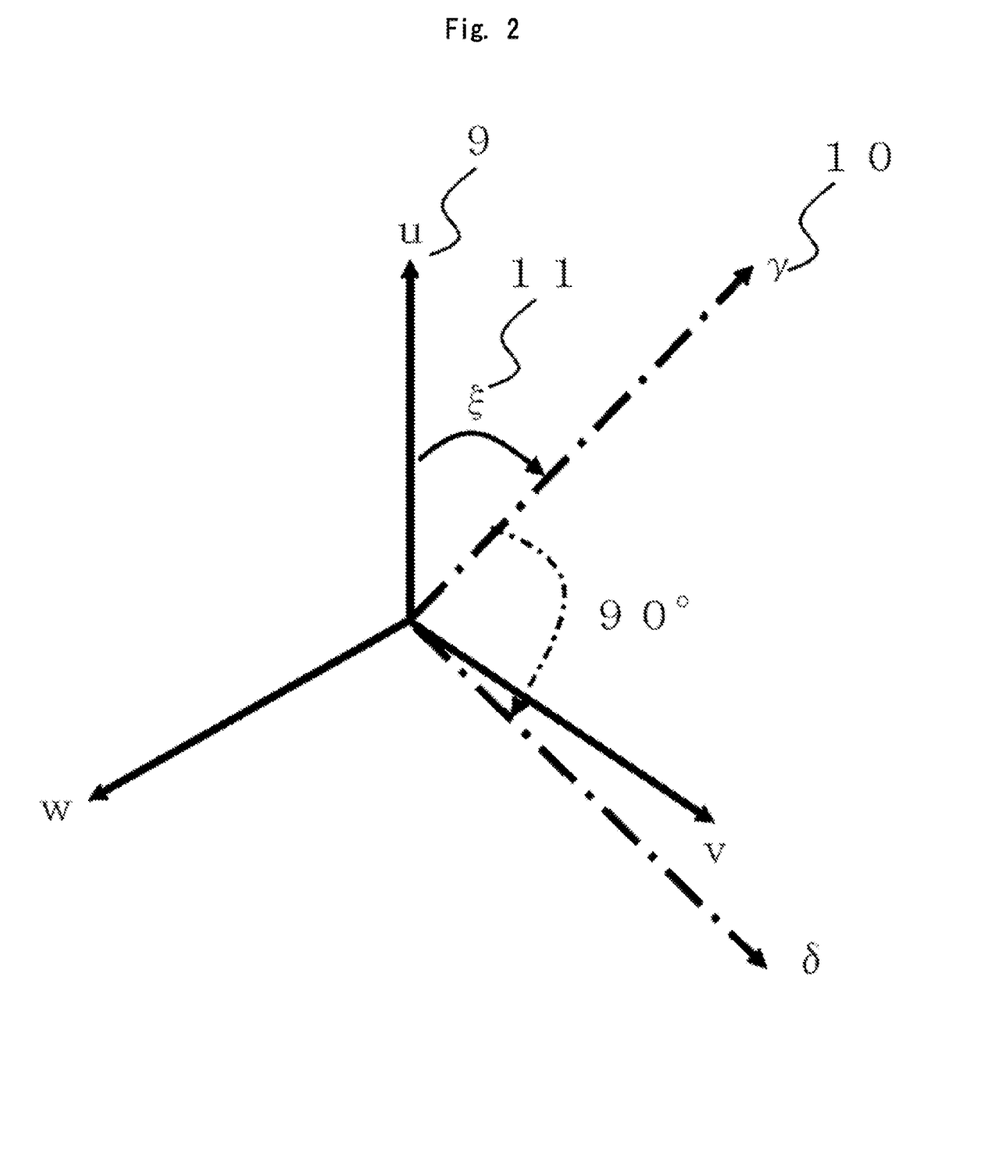
FIG. 2 is a view representing a relationship between a fixed coordinate system and an arbitrary rotation coordinate system according to Embodiment 1 of the present invention.

A current detector 4 detects a phase current Iuvw of the synchronous motor 8. A coordinate converter 5, as represented in FIG. 2, converts the phase current Iuvw into current on an arbitrary rotation coordinate system 10 composed of a y axis and a $\delta$ axis obtained by rotating by an arbitrary phase angle $\zeta$ with respect to a fixed coordinate system 9 composed of a u axis, a v axis and a w axis, and a y-axis current Iy thereamong is outputted. Here, in the invention, the y axis is used as an axis for observing current. A fundamental wave component extractor 6 extracts a frequency component Ihy, included in the y-axis current Iy as the output from the coordinate converter 5, same as that of the fundamental wave of the high frequency voltage. An inductance calculator 7 calculates a y-axis inductance Ly of the synchronous motor 8 using the output Ihy from the fundamental wave component extractor 6, the fundamental frequency fh of the high frequency rotation voltage, and the root-mean-square value Vh of the fundamental frequency component of the high frequency rotation voltage. A d-axis inductance Ld and a q-axis inductance Lq are calculation results from the inductance calculator 7 when the phase $\zeta$ of the arbitrary rotation coordinate system 10 with respect to the fixed coordinate system 9 is varied at an angle from 0 degree to 180 degrees in the coordinate converter 5, and the minimum value of the y-axis inductance Ly is specified to Ld, while the maximum value is specified to Lq.

Figure 3:
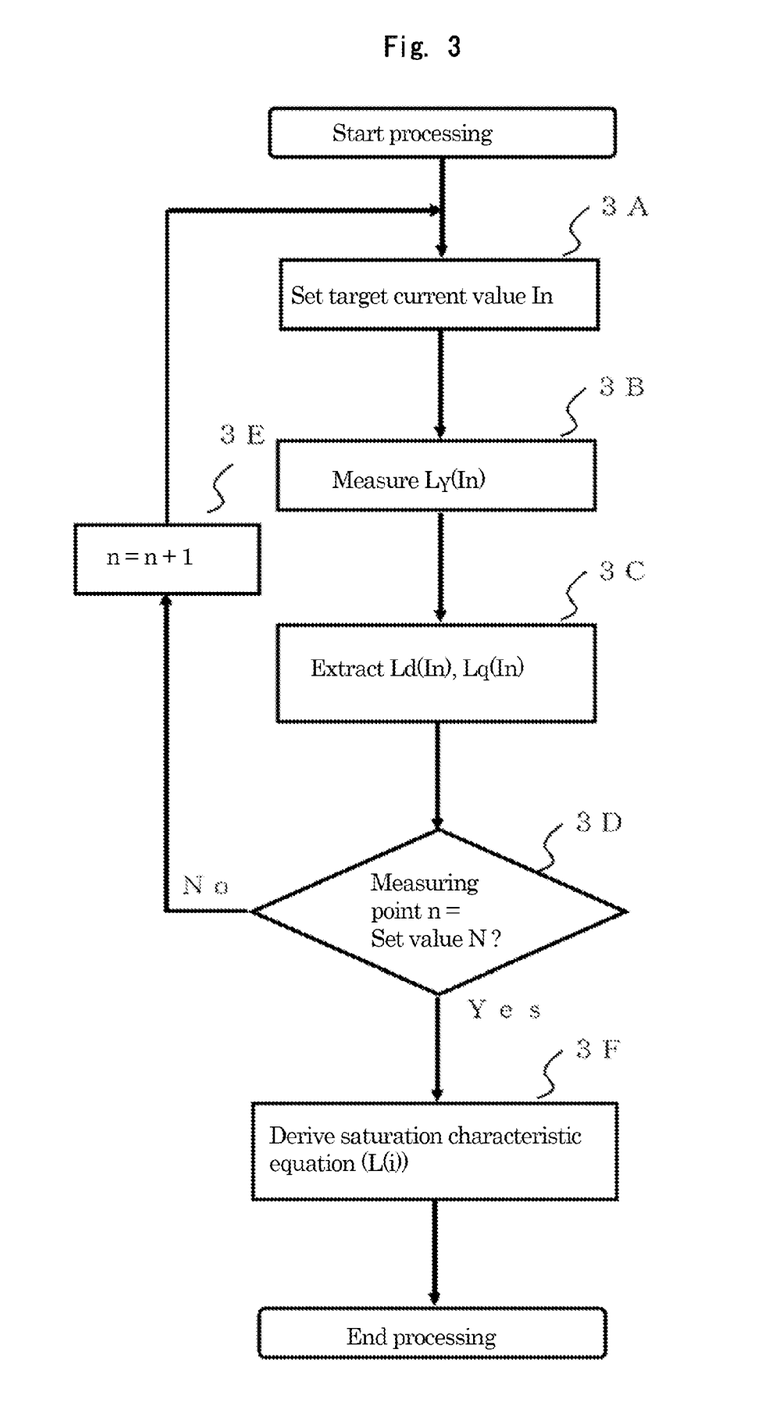
FIG. 3 is an operational flow chart of the inductance measuring device for the synchronous motor according to Embodiment 1 of the present invention.

FIG. 3 is an operational flowchart of the inductance measuring device for the synchronous motor according to Embodiment 1. First, in Step 3A, in order to measure inductance saturation characteristics of the synchronous motor with respect to currents flowing through the synchronous motor, target current values In (n=1, 2, 3, - - - , N) for measuring the inductance are set. Here, n is the measuring point number when the inductance is measured. Next, in Step 3B, y-axis inductances Ly(In) for the set target current values In are measured.

Figure 4:
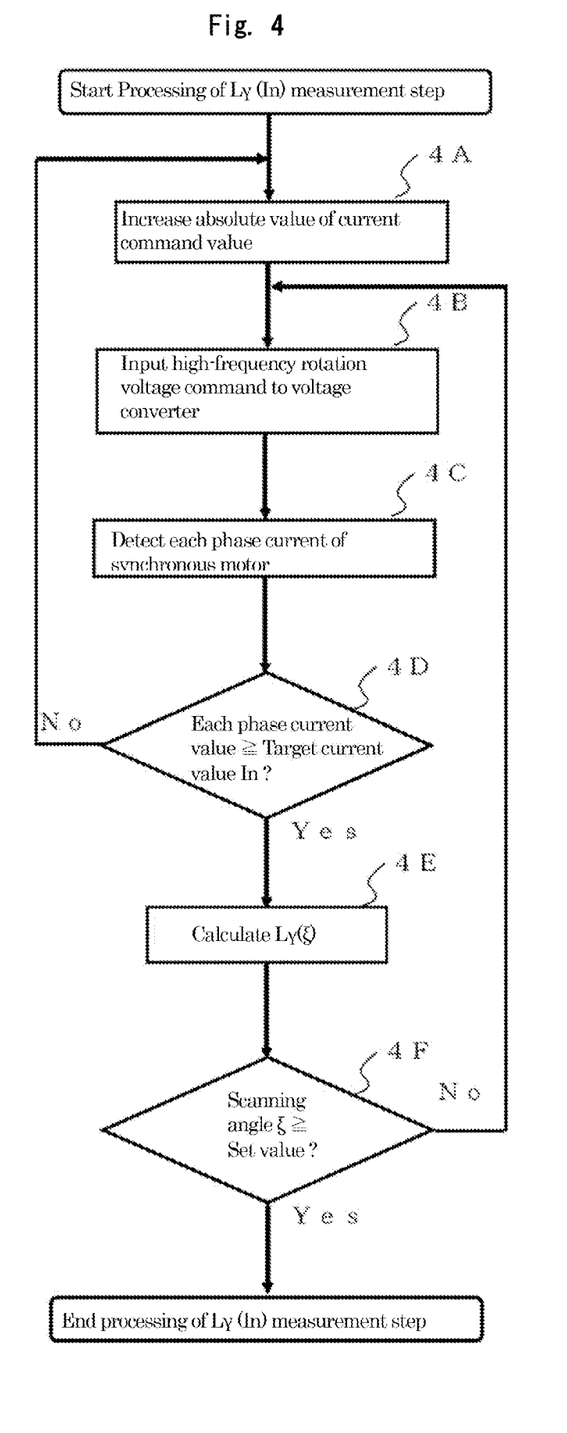
FIG. 4 is a processing flow chart for measuring a y-axis inductance Ly (In) among the operations of the inductance measuring device for the synchronous motor according to Embodiment 1 of the present invention.

A processing flow for measuring the y-axis inductances Ly(In) is represented in FIG. 4. Here, in Step 4A, in order to flow the target current value In through each phase of the synchronous motor 8, the absolute value of the voltage command value is increased by the voltage command generator 2, and in Step 4B, the high-frequency rotation voltage command is inputted into the voltage converter 3. Next, in Step 4C, each phase current of the synchronous motor 8 is detected by the current detector 4, and then in Step 4D, the detected each phase current value and the target current value In are compared. At this time, when the detected each phase current value is lower than the target current value In, again in Step 4A, the absolute value of the voltage command value is increased, and the processing since Step 4B is performed.

On the other hand, in Step 4D, when the detected each phase current value is the target current value In or higher, in Step 4E, an inductance distribution Ly($\zeta$) with respect to a rotor position of the synchronous motor is calculated in a condition of an amplitude of the voltage command in the voltage command generator 2 being fixed. Here, Ly($\zeta$) is inductance in a direction of the y axis when the phase of the y axis is ζ degree while the phase of the arbitrary rotation coordinate system 10, that is, the phase of the γ axis measured from the u phase, is varied from 0 degree to 180 degrees.

Figure 5:
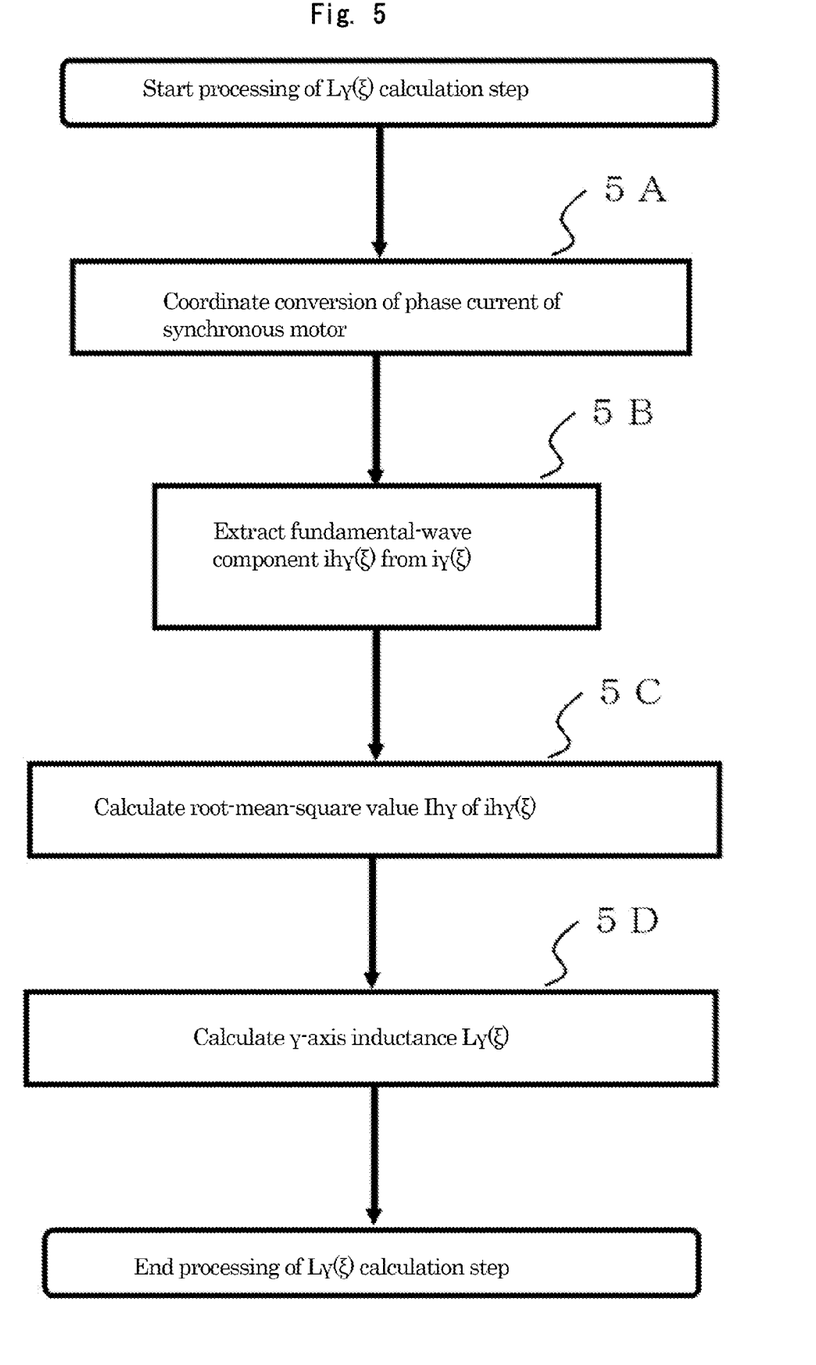
FIG. 5 is a processing flow chart for calculating Ly($\zeta$) among the operations of the inductance measuring device for the synchronous motor according to Embodiment 1 of the present invention.

In FIG. 5, a calculation processing flowchart of Ly(ζ) is represented. First, in Step 5A, by converting the phase current of the synchronous motor 8 into current on the arbitrary rotation coordinate system 10 composed of the y axis and the δ axis rotated by the arbitrary phase angle of with respect to the fixed coordinate system 9 composed of the u axis, the v axis, and the w axis, a y-axis current iy(ζ) is obtained.

Next, in Step 5B, a fundamental wave component ihy(ξ) is extracted from the y-axis current iy(ξ) by a method such as a publicly known digital filter or Fourier transform, and then in Step 5C, a root-mean-square value ihy(ξ) of the y-axis current iy(ξ) is calculated. Then, in Step 5D, the three-phase voltage command is converted into voltage values on the arbitrary rotation coordinate system 10 composed of the y axis rotated at the arbitrary phase angle of ξ and the δ axis against the fixed coordinate system 9 composed of the v axis, the v axis, and the w axis, and, based on the fundamental-wave root-mean-square value Vhy, the frequency fh, and the fundamental-wave root-mean-square value IHy of the y-axis current the y-axis directional inductance Ly(ξ) positioned at the phase ξ from the u phase is calculated therein.

The series of processing schemes from Step 4A to Step 4E, and from Step 5A to step 5D are repeated, in a given sampling interval, at a given frequency sufficiently lower than the fundamental frequency of the high frequency rotation voltage, while varying ζ in a specified direction within a scanning section range of ζ previously set by a synchronous-motor controller. Here, the scanning section indicates a varying range of ζ for measuring the y-axis inductance, which is previously set so as to scan for at least half a period of an electrical angle of the synchronous motor, that is, to scan for 180 degrees or more. In the previously set ζ scanning section, after the series of processing has been completed, and, in Step 4F, the calculation of the value of Ly(ζ) has been completed for one period or more of the inductance distribution with respect to the rotor position of the synchronous motor, the measurement of the y-axis inductance Ly(In) at the set value of In is completed.

Next, in Step 3C, the maximum value and the minimum value of the fundamental-wave root-mean-square value Ihy (In) of the y-axis current measured as above are extracted, which are specified as a d-axis current Id and a q-axis current Iq, respectively. Then, the mininum value and the maximum value of the y-axis inductance Ly(In) are extracted, which are specified as a d-axis inductance Ld and a q-axis inductance Lq, respectively.

Moreover, in Step 3D, when the measuring point number n is lower than a value N that is previously set by the synchronous motor controller, by incrementing the number n in Step 3E and repeating the processing from Step 3A to Step 3C, the inductance values corresponding to a plurality of synchronous-motor current values are measured. Then, when the measuring point number n equals to the previously set value N, in Step 3F, for a plurality of measurement results of the measured Id and Ld, and Iq and Lq, the inductance saturation characteristics are derived as a current function L(i) using a method such as a least-square method.

Figure 6:
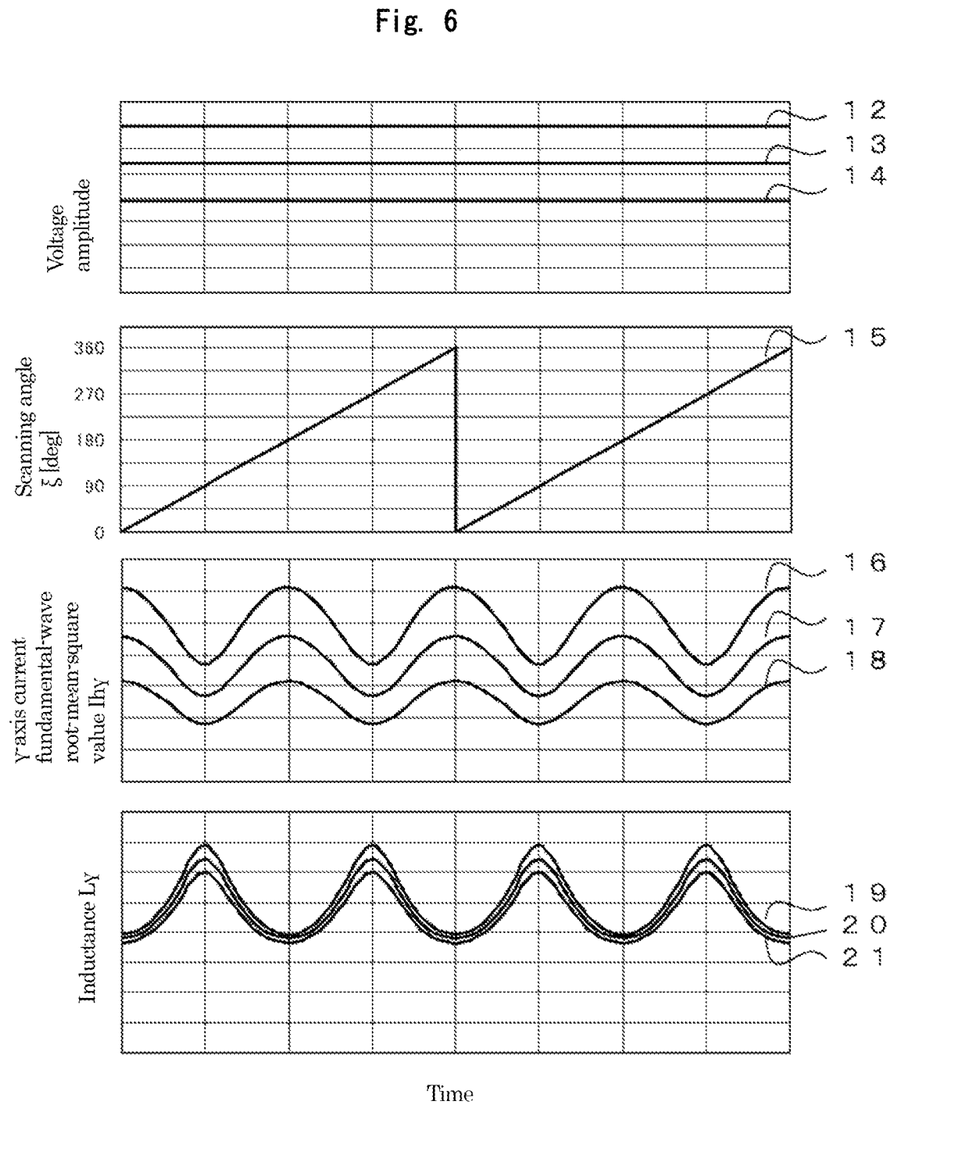
FIG. 6 is a time chart for inductance measurement according to Embodiment 1 of the present invention.

Here, FIG. 6 is a time chart of the inductance measurement according to Embodiment 1 of the present invention. It is found that, at each point of a scanning angle 15, a y-axis current fundamental-wave root-mean-square value 18 and a y-axis inductance 19 can be obtained for a voltage amplitude 14, a y-axis current fundamental-wave root-mean-square value 17 and a y-axis inductance 20 can be obtained for a voltage amplitude 13, and a y-axis current fundamental-wave root-mean-square value 16 and a y-axis inductance 21 can be obtained for a voltage amplitude 12.

As described above, in Embodiment 1 according to the present invention, because the voltage command generated by the voltage command generator 2 is a three-phase high-frequency rotation voltage, and its method is different from that in which coordinate conversion is performed to an ac voltage command in a single-axis direction, and an alternating-current voltage is applied to each direction, the coordinate conversion for directly generating the three-phase voltage command is not needed, and, additionally, the voltage can be simultaneously applied in all phase directions of the motor. Therefore, the time needed for applying the voltage to the motor can be shortened; as the result thereof, the time needed for measuring the inductance of the synchronous motor can be shortened.

Because, in the coordinate converter 5, by giving the phase ζ of the y axis as the current observation axis over the section for a half period or more of the electrical angle of the synchronous motor, the d-axis inductance Ld and the q-axis inductance Lq can be obtained, the inductance can be measured without preliminarily detecting the magnetic-pole position. Moreover, because the high-frequency signal itself is used as the voltage command, different from a method of overlapping with the command value, a current control calculator, etc. is needless, and the inductance of the synchronous motor can be measured by a simple configuration.

Embodiment 2

In Embodiment 1, it is configured in such a way that Ld and Lq are obtained from the minimum value and the maximum value of the calculation result L_y by the inductance calculator 7, respectively However, by calculating the inductance using the maximum value Id and the minimum value Iq of the output ih_y from the fundamental-wave component extractor 6, the d-axis inductance Ld and the q-axis inductance Lq can be directly calculated without obtaining L_y(ζ) for all ζ values in the ζ scanning section; therefore, Ld and Lq can be obtained with a less calculation amount.

Embodiment 3

In Embodiment 1, the kind of the wave form of the high-frequency voltage command is not mentioned. However, by using a rectangular-wave type voltage command as a command given to a triangular-wave-comparison PWM-type voltage converter by which a rectangular wave is outputted, the voltage error between the front and rear of the voltage converter 3 becomes smaller comparing to the case of the sine wave; therefore, the measuring accuracy can be improved.

EXPLANATION OF REFERENCES

1: Inductance measuring device
2: Voltage command generator
3: Voltage converter
4: Current detector
5: Coordinate converter
6: Fundamental wave component extractor
7: Inductance calculator
8: Synchronous motor
9: Fixed coordinate system
10: Arbitrary rotation coordinate system

What is claimed is:
1. An inductance measuring device for a synchronous motor comprising:
a voltage signal generator for generating a high-frequency voltage signal to be inputted to a voltage converter;

a voltage converter for converting the high-frequency voltage signal to apply to the synchronous motor;

a current detector for detecting a current of the synchronous motor;

a coordinate converter for converting the current detected by the current detector into a current on an orthogonal biaxial coordinate system positioned in an arbitrary phase with respect to a fixed coordinate system, to output a current in one axis of the orthogonal biaxial coordinate system;

a fundamental wave component extractor for extracting the same frequency component as that of the high-frequency voltage included in the current in the one axis of the orthogonal biaxial coordinate system; and an inductance calculator for calculating an inductance from a root-mean-square value and a frequency of the high-frequency voltage, and an output from the fundamental wave component extractor, wherein, in the generating the high-frequency voltage signal, the voltage signal generator generates a variable voltage root-mean-square value, and a three-phase high-frequency rotation voltage signal having a frequency, as a fundamental frequency, sufficiently higher compared with the maximum value of a rotation frequency at which the synchronous motor can synchronously rotate, and outputs the variable voltage root-mean-square value and the three-phase high-frequency rotation voltage signal to the voltage converter as the high-frequency voltage signal.

2. The inductance measuring device for the synchronous motor as recited in claim 1, wherein the fixed coordinate system of the coordinate converter is a coordinate system composed of a u axis, a v axis, and a w axis, and the orthogonal biaxial coordinate system is composed of a y axis and δ axis, in which the current in the one axis of the orthogonal biaxial coordinate system is a y axis current.

3. The inductance measuring device for the synchronous motor as recited in claim 1, wherein the coordinate converter obtains, by converting from the fixed coordinate system to the orthogonal biaxial coordinate system at least at an electrical angle of 180 degrees, a d-axis inductance and a q-axis inductance of the synchronous motor from the minimum value and the maximum value of the inductance calculator.

* * * * *